United States Patent
Jaiswal et al.

(10) Patent No.: US 10,593,397 B1
(45) Date of Patent: Mar. 17, 2020

(54) MRAM READ AND WRITE METHODS USING AN INCUBATION DELAY INTERVAL

(71) Applicant: Arm Limited, Cambridge (GB)

(72) Inventors: Akhilesh Ramlaut Jaiswal, West Lafayette, IN (US); Mudit Bhargava, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/213,804

(22) Filed: Dec. 7, 2018

(51) Int. Cl.
  *G11C 11/56* (2006.01)
  *H01L 27/22* (2006.01)
  *G11C 11/16* (2006.01)
  *H01L 43/08* (2006.01)

(52) U.S. Cl.
  CPC ...... *G11C 11/5607* (2013.01); *G11C 11/1673* (2013.01); *G11C 11/1675* (2013.01); *H01L 27/228* (2013.01); *H01L 43/08* (2013.01)

(58) Field of Classification Search
  USPC .................................................. 365/185.02
  See application file for complete search history.

(56) References Cited

U.S. PATENT DOCUMENTS

| | | | | |
|---|---|---|---|---|
| 5,617,350 | A * | 4/1997 | Roohparvar | G11C 16/26 365/185.02 |
| 8,830,741 | B1 * | 9/2014 | Willey | G11C 13/0069 365/148 |
| 2008/0106927 | A1 * | 5/2008 | Celinska | H01L 45/04 365/148 |
| 2009/0109726 | A1 * | 4/2009 | Shepard | G11C 8/10 365/105 |
| 2011/0292715 | A1 * | 12/2011 | Ishihara | G11C 7/12 365/148 |
| 2013/0182498 | A1 * | 7/2013 | Aoki | G11C 11/1675 365/158 |
| 2015/0348595 | A1 | 12/2015 | Baker et al. | |

OTHER PUBLICATIONS

Kim, et al.; Spin-Hall Effect MRAM Based Cache Memory: A Feasibility Study; 73rd Annual Device Research Conference (DRC); 2015.
Kim, et al.; Scaling Analysis of In-planeand Perpendicular Anisotropy Magnetic Tunnel Junctions Using a Physics-Based Model; 72nd Device Research Conference; 2014.
Noguchi, et al.; D-MRAM Cache: Enhancing Energy Efficiency with 3T-1MTJ DRAM / MRAM Hybrid Memory; 2013 Design, Automation & Test in Europe Conference & Exhibition (DATE); 2013.
Jiang, et al.; Constructing Large and Fast Multi-Level Cell STT-MRAM based Cache for Embedded Processors; DAC 2012; 2012.

* cited by examiner

Primary Examiner — Tan T. Nguyen
(74) Attorney, Agent, or Firm — Pramudji Law Group PLLC; Ari Pramudji

(57) ABSTRACT

In a particular implementation, a method to perform a read operation on a magneto-resistive random-access memory (MRAM) bit-cell includes: providing a voltage signal across one or more storage elements of the MRAM bit-cell, determining an electrical resistance of the one or more storage elements of the MRAM bit-cell, and removing the voltage signal from the MRAM bit-cell prior to an end of an incubation delay interval.

20 Claims, 7 Drawing Sheets

MRAM READ AND WRITE METHODS USING AN INCUBATION DELAY INTERVAL

I. FIELD

The present disclosure is generally related to MRAM device read and write methods utilizing an incubation delay interval.

II. DESCRIPTION OF RELATED ART

Unlike conventional random-access memory (RAM) chip technologies, in magnetic RAM (MRAM), data is not stored as electric charge but is instead stored by magnetic polarization of storage elements. The storage elements are formed from two ferromagnetic layers separated by a tunneling layer. One of the two ferromagnetic layers that is referred to as the fixed layer or pinned layer has a magnetization that is fixed in a particular direction. The other ferromagnetic magnetic layer that is referred to as the free layer has a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device such as MRAM is built from an array of individually addressable MTJs.

To write data in a conventional MRAM, a write current, which exceeds a critical switching current, is applied through an MTJ, for a write time, which exceeds a critical switching time. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read-current flows through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bit-cell of the MRAM. The two different resistances represent a logic "0" and a logic "1" value stored by the MTJ.

As an example, while conducting read operations, the occurrence of an undesired write operation (i.e., a destructive read operation, read disturb—the inadvertent switch to a write operation during a read operation) is a critical reliability concern. Currently, for MRAM devices, to prevent read disturb failures, a very low applied voltage (i.e., a Vread that is close to zero) is used for data read operations. However, in doing so, read operations may be slower and may require additional voltage. Moreover, various circuit designs may not be well calibrated at low voltages. Likewise, the occurrence of write disturbs, the inadvertent switching of the MRAM bit-cell during a write operation, is also a critical reliability concern. Hence, there is a need in the art for improved MRAM read and write methods.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 6A:
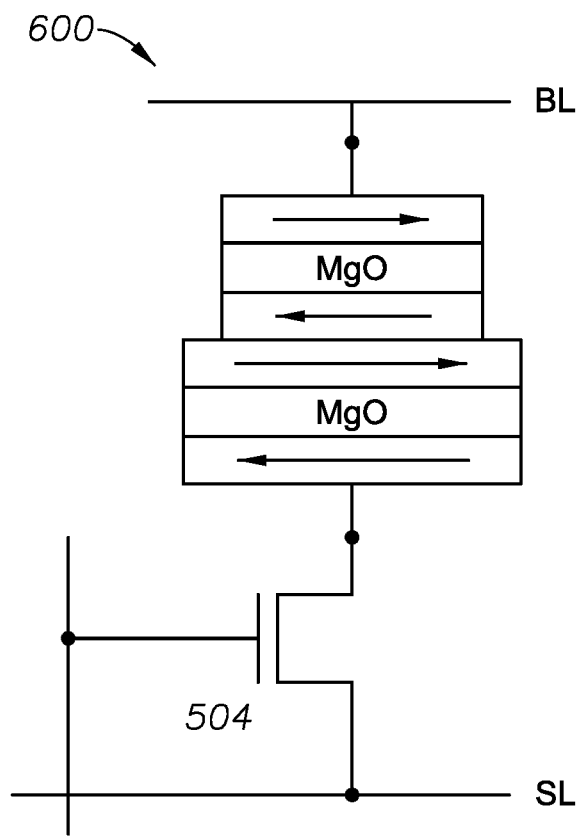
Figure 6B:
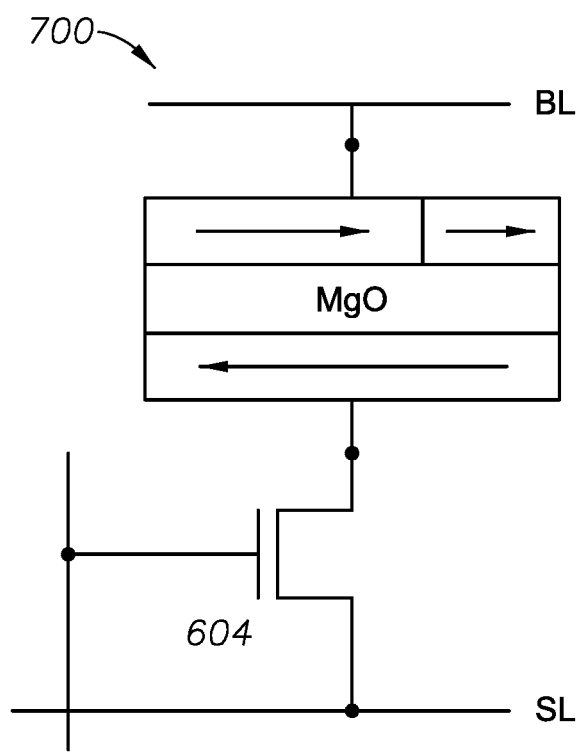

FIGS. 6A-B are schematic diagrams of other MRAM circuit designs implementable with the example methods for read and/or write operations.

Figure 6C:
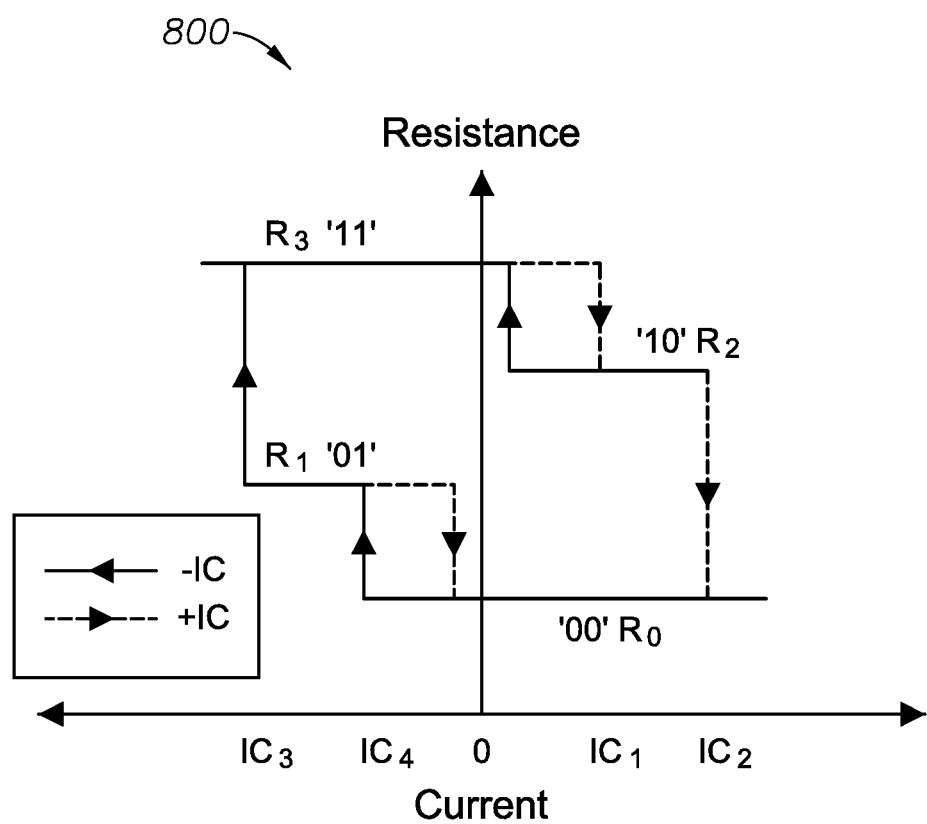

FIG. 6C is a diagram of an example two-step write operation of the MRAM circuit designs in FIGS. 6A-B.

Figure 7:
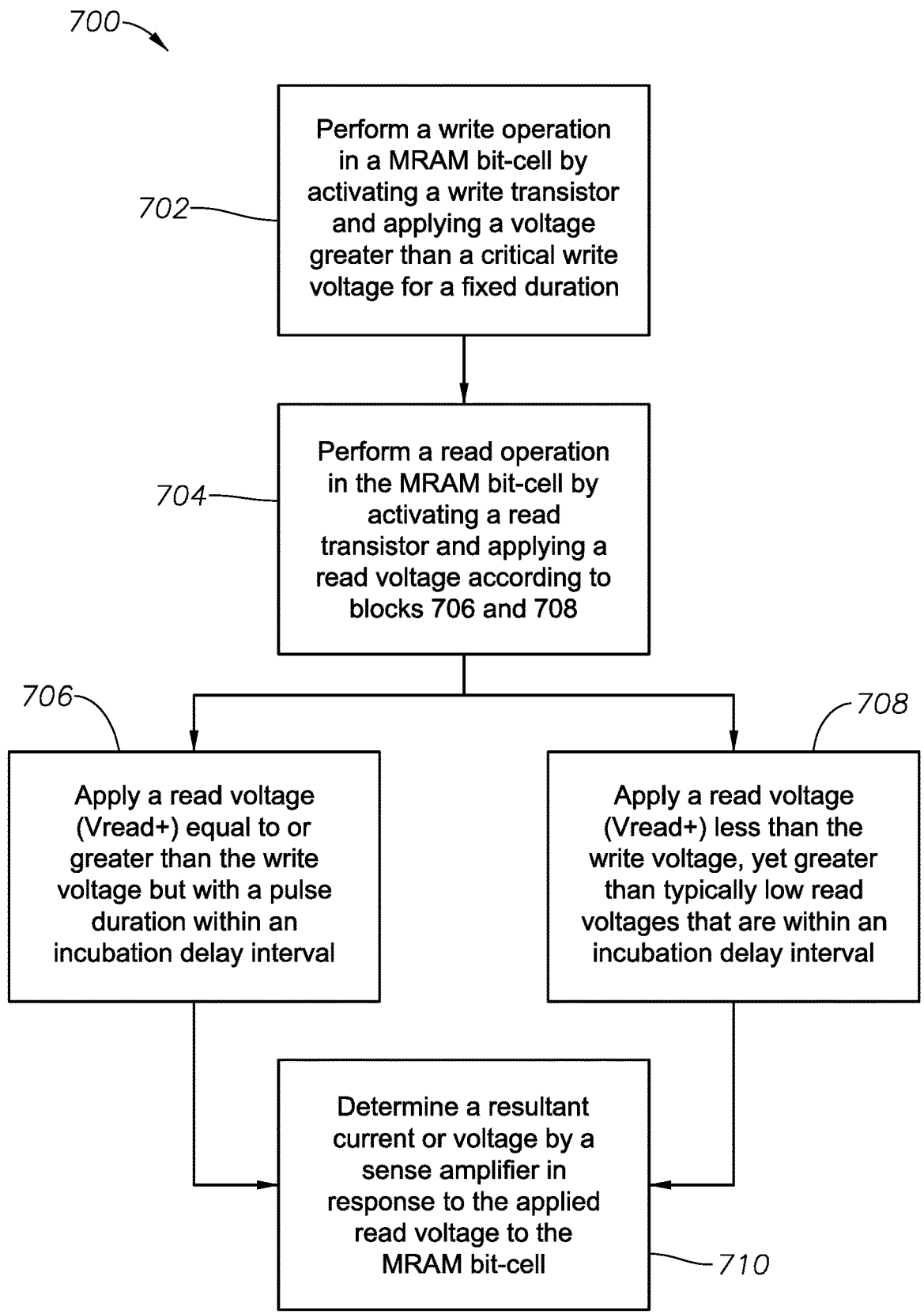

FIG. 7 is a flowchart applicable with example MRAM circuit designs.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

According to one implementation of the present disclosure, a method to perform a read operation on an MRAM bit-cell includes providing a voltage signal across one or more storage elements of the MRAM bit-cell, determining an electrical resistance of the one or more storage elements of the MRAM bit-cell, and removing the voltage signal from the MRAM bit-cell prior to an end of an incubation delay interval.

According to another implementation of the present disclosure, a method to perform read and write operations on a MRAM bit-cell includes, for a write operation: applying a first voltage signal across a resistive memory of the MRAM bit-cell, where the first voltage signal is greater than a critical write voltage, and where the first voltage signal is applied for a duration longer than a critical write duration; and for a read operation: applying a second voltage signal across the resistive memory of the MRAM bit-cell, where the second voltage signal is greater than or close to the critical write voltage.

According to another implementation of the present disclosure, a method to prevent an undesired write operation in an MRAM bit-cell includes responsive to a voltage signal being applied across one or more storage elements of the MRAM bit-cell, removing the voltage signal from the MRAM bit-cell prior to an end of an incubation delay interval.

Particular implementations of the present disclosure are described below with reference to the drawings. In the description, common features are designated by common reference numbers throughout the drawings.

In example implementations, an incubation delay, inherent in the physics of the spin-transfer torque (STT) switching mechanism for MRAMs, can be used to avoid read disturbs. Incubation delay is the delay time that a magnet (e.g., a magnetization polarization, a magnetization vector) spends in slowly rotating outwards before the STT torque is "strong enough" to be able to switch the magnet. While the associated current may be constant, the strength of the STT torque depends on the direction of the magnetization vector. Thus, as the magnet may start deviating from its stable direction, the strength of the STT torque may increase. Moreover, the STT torque may reach a maximum strength when the magnetization vector and a fixed layer are at 90 degrees. In an example STT-MRAM, the data-write mechanism may rely on the STT effect due to current flowing through an MTJ. For instance, to write data into an example MTJ device, the strength of the STT effect is positively correlated to the magnetization vector product of the free and reference layers of the MTJ device. However, prior to a data write operation, the magnetization of the free and reference layers of the MTJ may be collinear (parallel or anti-parallel depending on the initial data bit stored in the MTJ device) except for a slight misalignment as a result of thermal fluctuations. Consequently, at the initial stage of a data write operation, the STT drivability may not have sufficient strength, but is enhanced through the magnetization reversal process of the free layer. During the magnetization reversal of the free layer, the magnetization of the reference layer of the MTJ may be generally pinned, thus the magnetization vector angle between the free and reference layers of the MTJ may increase gradually via oscillation. At last, when the STT effect is strong enough to overcome the energy barrier (i.e., tipping point, threshold), the magnetization of the free layer may be "flipped" (switched) resulting in a successful data write operation. This time interval spent in pre-switching oscillations for the magnetization reversal is the incubation delay.

Figure 1:
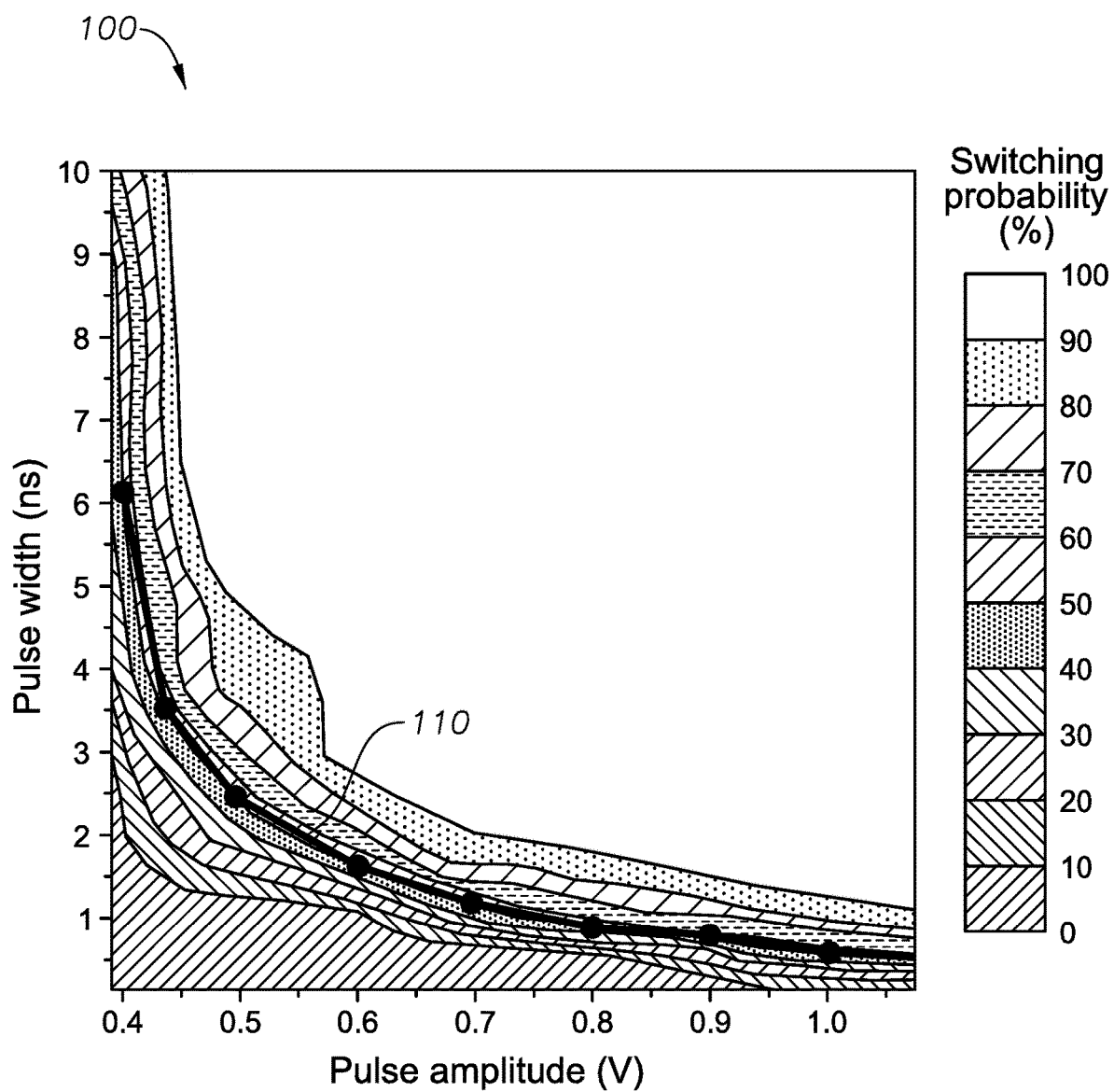
FIG. 1 is an operating map of an example MRAM bit-cell.

Referring to FIG. 1, an example operating map 100 is shown. As depicted as a cartesian X-Y graph, the operating map 100 illustrates the switching probability between read and write operations of an example MRAM bit-cell. Specifically, the operating map 100 represents a time duration (i.e., pulse width) in nanoseconds (ns) as a function of applied energy (i.e., pulse amplitude, applied voltage) in voltage (V). Hence, the "upper-left corner" of the graph may represent a high MTJ-lifetime, a high switching energy, and a switching speed, while the "lower-right corner" of the graph may represent a low MTJ-lifetime, a low switching energy, but a higher switching speed. The operating map 100 also includes an example curve 110 (i.e., an approximate critical switching current curve that provides a contour for separating regions that switch and regions that do not with a probability of 50%) that distinguishes the operating regions suitable for read and write operations. In general, points with high switching probability may be chosen for reliable write operation and those with low switching probability may be chosen for reliable read operation. For example, operating points (i.e., various applied voltages) that fall significantly above the example curve 110 have a higher switching probability (e.g., close to 100%), and therefore would likely result in a successful write operation occurring in an MRAM bit-cell. Alternatively, operating points that fall significantly below the example curve 110 have a lower switching probability (e.g., close to 0%) and therefore may be chosen as appropriate points for MRAM read operation.

Similar to most non-volatile memories, MRAM bit-cells have certain requirements in terms of voltage and a duration of time to conduct read and write operations. As an example, a particular voltage would be applied across the bit-cells' terminals for a particular time duration. As shown in the operating map 100, operating points in the upper region (above the curve 110) likely represent a successful write operation, in that the applied voltage to the MRAM bit-cell is greater than a critical write voltage for a respective critical write duration. Moreover, to ensure a successful MRAM read operation, a circuit designer would desire to remain safely within the lower region (below the curve 110). In doing so, in transitioning from a write operation to a read operation, current methods rely on reducing the applied voltage to the MRAM bit-cell such that the pulse amplitude falls below the critical write voltage.

In contrast, for MRAM read operations, the inventive methods as described herein utilize an incubation delay interval to determine a duration of time (i.e., a pulse width) that a particular MRAM bit-cell receives an applied voltage. Hence, as one example, for a successful read operation, the same (or even slightly higher) applied voltage that was required for a write operation (i.e., an applied voltage that is greater than a critical write voltage) may be used so long as the applied voltage is removed prior to an end of an incubation delay interval (i.e., a critical write duration). Advantageously, as long as the applied voltage is removed within the incubation delay interval, an associated operating point would be safely within the lower region (below the curve 110), and thus, a read operation may occur with a faster speed without disturbing MTJ data in the particular MRAM bit-cell.

Advantageously, the inventive methods allow for the capability to perform read operations at higher voltages that would otherwise have been destructive if not ended quickly within the incubation delay period. Hence, the operations would not end up as undesired write operations. Moreover, by using a higher voltage, circuit configurations are generally more robust, reliable, and allow for faster read times. For example, a higher (i.e., a greater) voltage for a read operation would result in higher read currents that may be sensed faster. Furthermore, by using higher read voltages, design challenges that are present in low voltage operation may be avoided. For example, at higher read voltages, a designer now has the capability to not have to implement another intermediate voltage level (e.g., a dedicated read voltage, low Vread). Thus, by not having to use a dedicated read voltage, advantageously, the same or substantially similar voltage levels may be used for both read and write operations. Hence, less complexity in circuit operation may be realized.

Nevertheless, in some cases, the use of high voltages during read operations may have certain disadvantages. For example, the use of a higher read voltage may reduce the effective read $R_{ON}/R_{OFF}$ ratio, thereby affecting sense-margin. Also, the use of a higher read voltage may further result in reduced device endurance (i.e., device lifespan). As such, considering the trade-offs between the advantages and disadvantages of using a higher read voltage may result in a choice of an intermediate read voltage level (e.g., 0.6-0.8V) that is greater than the typical read voltages (e.g., 0.3-0.4V) but still significantly below the regular supply voltage (e.g., approximately 1V) or voltages used in write operations or for use in other circuit bit-cells (e.g., approximately 1.5V). For instance, as shown in FIG. 1, such an intermediate voltage could be close to 0.6V with a pulse-width of 1 ns which would still provide some or most of the advantages (such as greater device lifespan and effective $R_{ON}/R_{OFF}$ ratio) but would not have all or most of the disadvantages (such as a slower read speed and a read voltage that is in a range where specific low voltage circuits, including complex voltage level shifters, may be required).

In such cases, both the pulse width and pulse amplitude components can be modified to ensure that a read operation occurs safely in the lower region (i.e., a region below the curve 110 where switching probability is close to zero) as shown in FIG. 1. In these instances as well, the applied voltage to an example MRAM bit-cell may be lower, the same, or even slightly higher than a critical write voltage for a respective critical write duration (e.g., in certain instances, a time duration that may be longer than a particular fixed time duration).

Moreover, there can also be circumstances, independent from read and/or write operations, where it may be beneficial to remove a voltage signal from the example MRAM bit-cell prior to an end of an incubation delay interval (when the voltage signal has been applied across one or more storage elements of the MRAM bit-cell). For example, when the example MRAM bit-cell is exposed to a high voltage (e.g., greater than a critical write voltage) for a short duration (e.g., in implementing particular Boolean compute operations including one or more bit-cells at approximately the same time or performing another operation to some other bit-cell when subjected to noise in the voltages of controlling signals), a circuit designer would want to ensure that an undesired write operation does not occur. In such instances, or others, removal of the voltage signal within the incubation delay interval prevents a bit upset from taking place.

Figure 2:
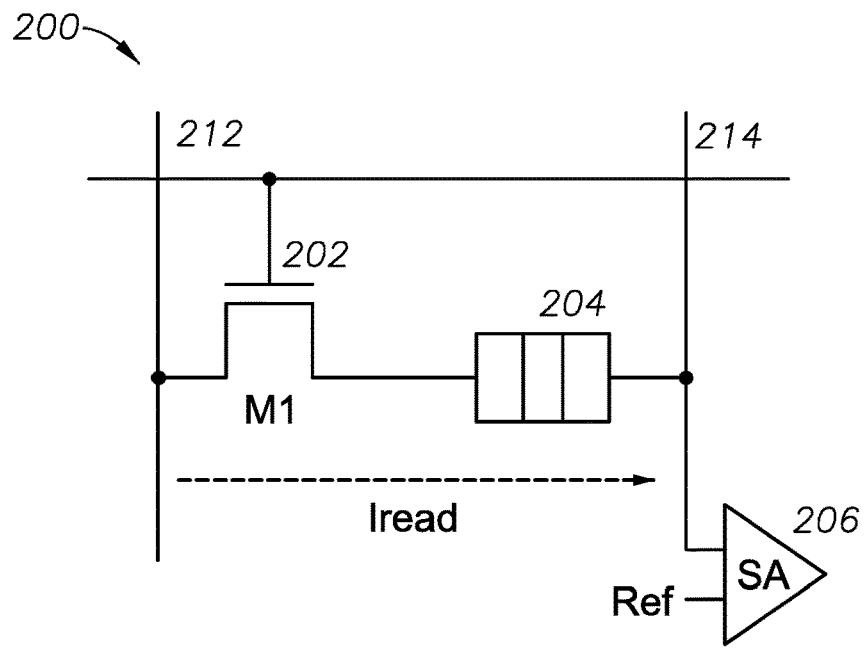
FIG. 2 is a schematic diagram of an MRAM circuit design implementable with example methods for read and/or write operations.
Figure 3:
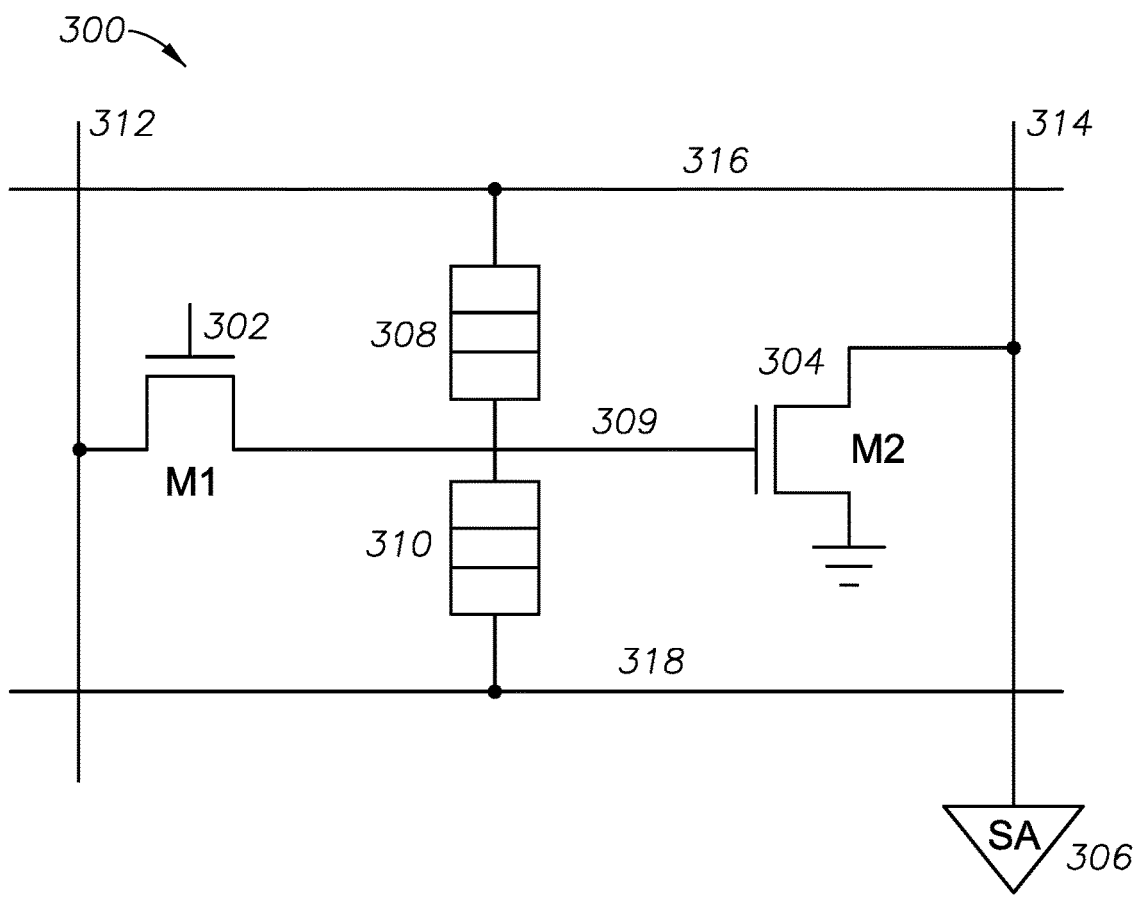
FIG. 3 is a schematic diagram of another MRAM circuit design implementable with the example methods for read and/or write operations.
Figure 4:
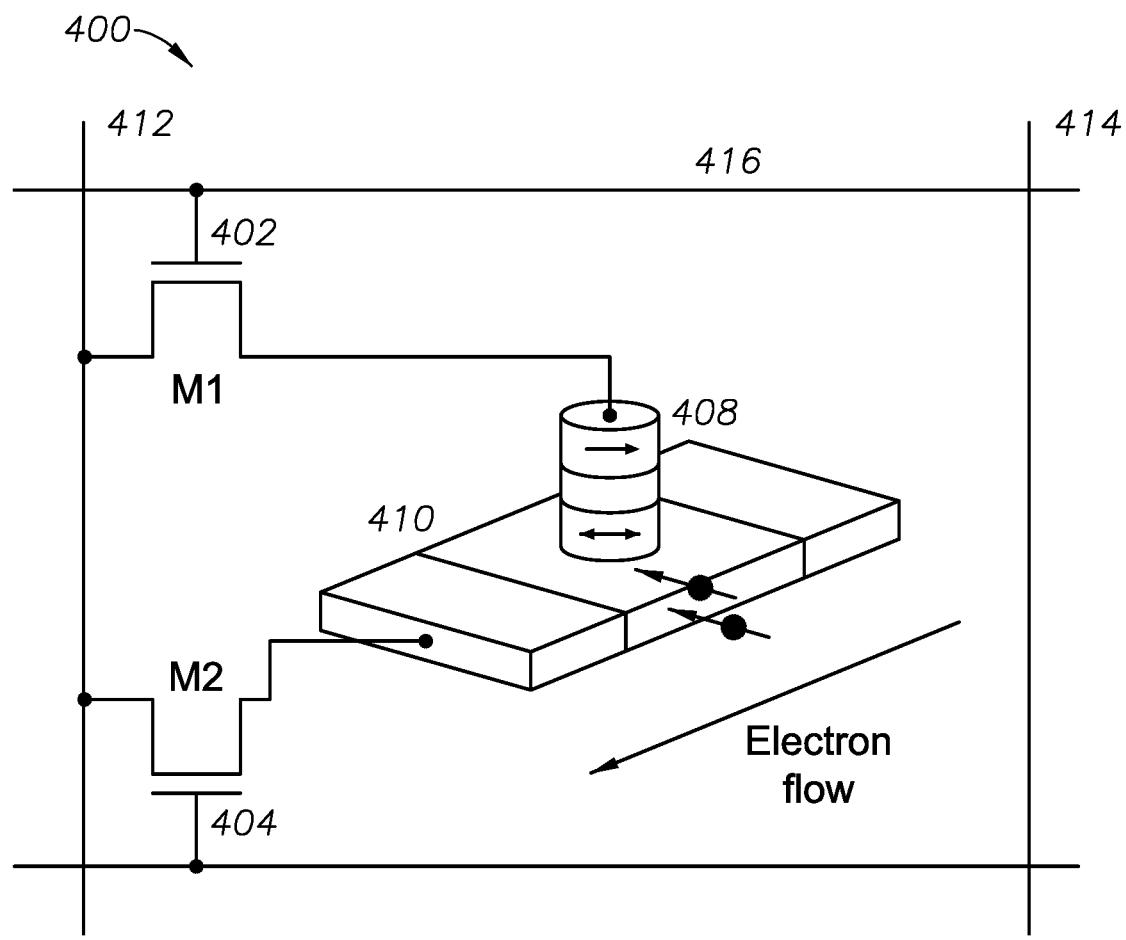
FIG. 4 is a schematic diagram of another MRAM circuit design implementable with the example methods for read and/or write operations.
Figure 5:
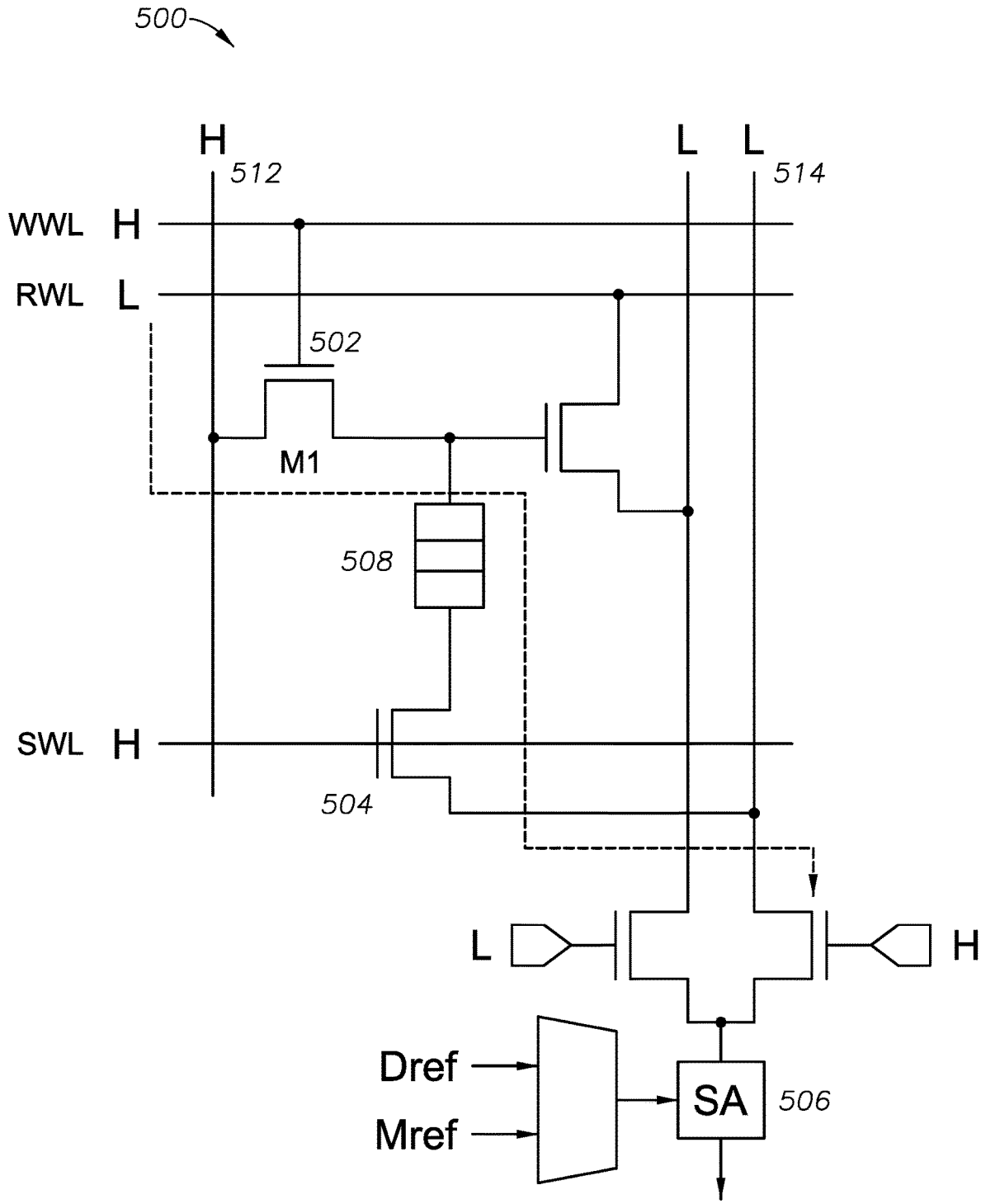
FIG. 5 is a schematic diagram of another MRAM circuit design implementable with the example methods for read and/or write operations.

In certain examples, the inventive methods may be implemented in various families of MRAM bit-cells including: spin-transfer torque MRAMs (STT-MRAMs) having one or more metal-oxide-semiconductor field-effect transistors (MOSFETs), spin-Hall effect MRAMs (SHE-MRAMs), or single or multi-bit encoded MRAM cells. In example implementations including STT-MRAMs with one or more MOSFETs, FIG. 2 illustrates a one transistor, one resistor (i.e., 1T1R) MRAM circuit design, FIG. 3 illustrates an MRAM voltage-divider bit-cell, and FIG. 5 illustrates an example of MRAM embedded in DRAM circuit. In an example implementation of SHE-MRAM family of MRAM bit-cells, FIG. 4 illustrates one example of SHE-MRAM-based cache memory. Also, in example implementations of multi-bit encoded MRAM cells, FIGS. 6A-6B illustrate two examples of multi-level cell (MLC) MRAM cells.

Referring to FIG. 2, an example MRAM circuit design 200 implementable with the example methods is shown. As depicted in FIG. 2, the example MRAM circuit design 200 corresponds to a MRAM bit-cell (i.e., 1T1R bit-cell 200) including a transistor (M1) 202 and an MTJ device 204 (i.e., a storage element, a resistive memory). Using the 1T1R bit-cell 200, for a read operation, a voltage may be applied across the two terminals of the bit-cell, between the source-line 212 and the bit-line 214, such that a voltage signal provided across the MTJ device 204. Initially, the voltage (i.e., pulse amplitude) may be applied as Vread or Vread+ (i.e., a voltage greater than Vread). Advantageously, in some cases, Vread+ may be substantially equal to $V_{DD}$, the operating voltage (e.g., the supply voltage) (e.g., 1V) of the MRAM bit-cell 200. Advantageously, by using $V_{DD}$, a circuit designer would not be required to also have to utilize a lower voltage (e.g., Vread) for a read operation. Moreover, as circuits inherently show more variations at lower voltages, sensing circuits designed to operate at Vread could be more complex and less cost effective as compared to those that are designed to operate at Vread+. Furthermore, post-sensing, in certain examples, the voltage signal would be converted to $V_{DD}$. Accordingly, a voltage level-shifter would be needed. Voltage level-shifters that shift signals across a large voltage difference (e.g., Vread domain to $V_{DD}$ domain) are typically more complex and have more variable performance as compared to voltage level shifters that shift signals across a smaller voltage difference (e.g., Vread+ domain to $V_{DD}$ domain). Further, if Vread+ is equal to $V_{DD}$, a level-shifter is no longer needed, and a simpler, faster, and more cost-efficient circuit may be realized.

Also, by having a higher pulse amplitude, a read operation may occur substantially faster in comparison to an applied lower pulse amplitude. As a result of the applied voltage on the MTJ device 204, an electrical resistance of the MTJ device 204 may be established through a current (i.e., Iread having a V=IR relationship with the applied voltage) that flows through the MTJ device 204 and received on the bit-line 214. On the bit-line 214, this current (or its corresponding voltage) may be input through an example sense amplifier 206. In some instances, the electrical resistance 204 may be determined by a comparison of the current (or its corresponding voltage) and a current (or its corresponding voltage) of a reference element. Advantageously, similar to other circuit designs (as described herein), as long as a time duration (i.e., time interval) of a read operation of the example design 200 is less than a critical write time (i.e., the incubation delay), the voltage applied to the example design 200 may be safely set at the operating voltage, a critical write voltage, or even greater than the critical write voltage.

Referring to FIG. 3, an example MRAM circuit design 300 implementable with the example methods is shown. As depicted in FIG. 3, the example MRAM circuit design comprises a voltage-divider bit-cell 300 (i.e., "2T2R" bit-cell 300) including at least first and second MTJ devices (i.e., one or more storage elements, one or more resistive memories) 308, 310 and at least first and second transistors (M1, M2) (e.g., NMOS transistor devices) 302, 304. In conducting a read operation of the voltage-divider bit-cell 300, initially, a first voltage may be provided to pre-charge a read bit-line 314 (i.e., a first bit-line). In certain examples, the first voltage may be an operating voltage of the circuit (e.g., $V_{DD}$, the supply voltage). Next, a second voltage (e.g., Vread+) is provided across the one or more storage elements 308, 310. In such an example implementation, similar to the other MRAM bit-cells, the voltage divider bit-cell 300 includes a voltage ratio of "2," for example, such that an electrical resistance of the second MTJ device 310 is twice as much as the first MTJ device 308. Other implementations may include different voltage ratios. In a first example, if the voltage signal (e.g., Vread+) applied to a top line 316 of the voltage bit-cell 300 is 900 mV and if electrical grounding is applied to a bottom line 318, the voltage across the first and second MTJs would be 300 mV and 600 mV, respectively, computed through a voltage division calculation. As such, the first MTJ 308 would store to a digital "1" in a resistance-off ("$R_{off}$") state, and the second MTJ 310 would store to a digital "0" in a resistance-on ("$R_{on}$") state. Accordingly, a differential voltage 309 between the first and second MTJ's 308, 310 that is applied to the second transistor (M2) 302 would correspond to a digital "1". Alternatively, in another example, if the voltage applied to the bottom line 318 of the voltage bit-cell 300 (e.g., Vread+) is 900 mV and if the electrical grounding is applied to the top line 316, the voltage of the first and second MTJs 308, 310 would be 600 mV and 300 mV, respectively, computed through a voltage division calculation. As such, the first MTJ would store to a digital "0" in a resistance-off ("$R_{off}$") state, and the second MTJ would store to a digital "1" in a resistance-on ("$R_{on}$") state. In contrast to the first example, the differential voltage 309 between the first and second MTJ's 308, 310 that is applied to the second transistor (M2) 302 would now correspond to a digital "0". Next, in the example implementation, the differential voltage 309 is amplified through the second transistor (M2) to generate a differential current on the read bit-line 314, such that the read bit-line 314 would incur a different rate of voltage drop, which would be sensed (i.e., determined) at the sense amplifier 306. Upon determining the electrical resistance of the first and second MTJ's (i.e., one or more storage elements) 308, 310, the voltage signal, Vread+, is removed from the MRAM voltage-divider bit-cell 300 prior to the end of the incubation delay interval.

Advantageously, in the example voltage-divider bit-cell 300, by using a greater read voltage (e.g., Vread+), a faster and more reliable read sensing may be realized. For example, the sensing operation is direct function of the differential current through M2. The differential current is a function of the differential voltage at 309, which is turn is a direct function of Vread+.

$$\left( = \frac{Rup - Rdw}{Rup + Rdw} Vread + \right),$$

where Rup and Rdw are resistance of MTJs 308 and 310 respectively, respectively. Therefore, in general, a greater Vread+ would generate a greater differential current that may result in a more reliable read sense operation at the sense amplifier 306.

Referring to FIG. 4, an example MRAM circuit design 400 implementable with the example methods is shown. The MRAM bit-cell comprises a SHE-MRAM based memory including at least two transistors (M1, M2) (e.g., NMOS devices) 402, 404, an MTJ device 408 (i.e., a storage element, a resistive memory), and a spin-Hall metal (SHM) (e.g., Tungsten, Platinum, Iridium) 410. In conducting a read operation, similar to the example 1T1R MRAM in FIG. 2, initially a voltage signal is provided across the MTJ device 408. As an example, in FIG. 4, a read current may flow between a bit-line 412 and source-line 414 and through the SHM 410 and MTJ device 408. As a result of the applied voltage on the MTJ device 408 and SHM 410, an electrical resistance of the MTJ device 408 may be established through the read current (i.e., Iread having a V=IR relationship with the applied voltage) that flows through the MTJ device 408 and is received on a read word line (RWL) 416. On the RWL 416, this current (or its corresponding voltage) may be input through an example sense amplifier (not shown). In some instances, the electrical resistance may be determined by a comparison of the current (or its corresponding voltage) and a current (or its corresponding voltage) of a reference element. Advantageously, similar to other circuit designs (as described herein), as long a time duration of a read operation of the example design 400 is less than a critical write time (i.e., the incubation delay), the voltage applied to the example design 400 may be safely set applied at the operating voltage, a critical write voltage, or even greater than the critical write voltage.

Referring to FIG. 5, an example MRAM circuit design 500 implementable with the example methods is shown. The MRAM bit-cell 500 comprises a DRAM/MRAM hybrid memory including three transistors (3T) and one MTJ device (i.e., a storage element, a resistive memory). For a read operation, the MRAM read path may include two transistors (M1, M2) (e.g., NMOS devices) 502, 504 and one MTJ 508. Similar to the example 1T1R MRAM in FIG. 2, initially a voltage signal is provided across the MTJ device 508. As an example, in FIG. 5, when the MRAM bit-cell 500 is accessed, a voltage-divider path forms such that a read current may flow between a write bit line (WBL) 512 and source-line (SL) 514 and through the MTJ device 508. As a result of the applied voltage on the MTJ device 508, an electrical resistance of the MTJ device 508 may be established through the read current (i.e., Iread, the read current having a V=IR relationship with the applied voltage) that flows through the MTJ device 508 and is received on the SL 514. On the SL 514, this current (or its corresponding voltage) may be input through an example sense amplifier 506. In some instances, the electrical resistance may be determined by a comparison of the current (or its corresponding voltage) and a current (or its corresponding voltage) of a reference element (e.g., Dref and Mref). Advantageously, similar to other circuit designs (as described herein), as long a time duration of a read operation of the example design 500 is less than a critical write time (i.e., the incubation delay), the voltage applied to the example design 500 may be safely set at the operating voltage, a critical write voltage, or even greater than the critical write voltage.

Referring to FIGS. 6A-B, example MRAM circuit designs 600, 700, implementable with the example methods are shown. FIG. 6A illustrates an MRAM bit-cell including a multi-level cell (MLC) STT-MRAM having one transistor (1T) (504) (i.e., a NMOS device, an access device) and two vertically stacked MTJ devices (2R) (i.e., storage elements, resistive memories) that have different oxide barrier layers (e.g., MgO) and layer cross-sections (i.e., thicknesses). FIG. 6B illustrates an MRAM bit-cell including a multi-level cell (MLC) STT-MRAM having one transistor (1T) (604) (i.e., a NMOS device, an access device) and one MTJ device (1R), where a free layer of the MTJ device has two fields. For both types of MLC cells, as shown in FIGS. 6A-B, the two magnetic fields are switched at different spin-polarized currents. Their combinations form multiple resistance levels to represent multi-bit values. The field that requires large current to switch is referred to as hard-bit, while the field that requires smaller current to switch is referred to as soft-bit. For 2-bit data, the least significant bit (LSB) is the "soft-bit," while the most significant bit (MSB) is the "hard-bit."

For a particular write operation, two MTJs may be controlled by one access transistor so that the write current may pass through both MTJs at runtime. Hence, similar to other MRAM bit-cells as described herein, a voltage signal may be applied across a resistive memory of the MRAM bit-cell. Further, to complete a successful write operation, the voltage signal applied would be greater than a critical write voltage and applied for a longer duration than a critical write duration (e.g., compliance current). Because the current required to switch the hard-bit is higher than that of the soft-bit, as shown in a two-step write operation 800 in FIG. 6C, by changing the hard-bit (MSB), the soft-bit (LSB) would also change to have a substantially similar magnetic polarization (i.e., either '00' or '11' is written).

For each of the MRAM circuit designs 600, 700, an incubation delay interval can be utilized to perform a write operation. With reference to the two-step write operation 800 in FIG. 6C, instead of performing write operations using currents IC1 and IC2 at particular thresholds, pulse-width (i.e., time duration) thresholds may be used instead. As discussed in above paragraphs, the incubation delay interval may be closely related to the critical write voltage. Accordingly, the incubation delay interval may be closely related to a critical current requirement. As such, an increase in critical current would correspond to an MTJ device having a higher incubation delay. For instance, the incubation delay for a second MTJ (i.e., MTJ2) in the MLC bit-cell in FIG. 6C corresponding to the second critical current IC2 (i.e., the critical current for MTJ2 to switch from a P state to an AP state), is d2, and the incubation delay for the first MTJ (i.e., MTJ1) in the MLC bit-cell corresponding to the first critical current IC1 (i.e., the critical current for MTJ1 to switch from a P to an AP state), is d1, and since IC2 is greater than IC1, d2 may be larger than d1. Furthermore, as shown in FIG. 6C, third critical current IC3 and fourth critical currents IC4, correspond to the critical currents for MTJ1 and MTJ2 to switch from an AP to a P state, respectively. Accordingly, an example write operation would be as follows. The currents flow through the MLC for a particular duration, i.e., d3, which is greater than both d1 and d2. If initially, the MLC is at state '11' (R3 in FIG. 6C), and IC2 is passed through the MLC bit-cell, then with high probability, both the MTJs are written and the MLC goes to state 00 (R0). However, if the current IC1 was passed instead, then with high probability, MTJ1 would be written, but MTJ2 would not. Hence, the MLC goes to state '10' (R2 in FIG. 6C). Instead of using differential currents to write the MLC into different states, alternatively, one could use pulse width-controlled write operations with either same or varying currents, thereby, controlling selective writes in the MLC bit-cell. For example, a pulse width of d2 and current of IC2 may write '00' but a pulse width of d1 and current of IC2 will only write '10'.

In example implementations, certain circuit elements have been provided in the FIGS. 1-6 but whose redundant description has not been duplicated in the related description of analogous circuit elements herein. It is expressly incorporated that the same circuit elements with identical symbols and/or reference numerals are included in each of embodiments based on its corresponding figure(s).

Referring to FIG. 7, a flowchart for particular read and write operations 700 applicable for each of the above-mentioned example MRAM bit-cells 200-600 is shown. The operations 700 may be performed by any of the circuit designs 200-600 of FIGS. 2-6A-B. In certain implementations, the read and write operations may be performed independently of one another.

At block 702, the operations include performing a write operation in an MRAM bit-cell by activating a write transistor and applying a voltage greater than a critical write voltage for a fixed duration.

At block 704, the operations include performing a read operation in the MRAM bit-cell by activating a read transistor and applying either: a read voltage (Vread+) equal to or greater than the write voltage but with a pulse duration within an incubation delay interval, at block 706, or a read voltage (Vread+) less than the write voltage, yet greater than typical low read voltages (e.g., around 0.6V which is greater than the typical low read voltages that are close to 0V) within an incubation delay interval, at block 708.

At block 710, the operations include determining a resultant current or voltage by a sense amplifier in response to the applied read voltage to the MRAM bit-cell.

Although one or more of FIGS. 1-6A-C may illustrate systems, apparatuses, or methods according to the teachings of the disclosure, the disclosure is not limited to these illustrated systems, apparatuses, or methods. One or more functions or components of any of FIGS. 1-6A-C as illustrated or described herein may be combined with one or more other portions of another of FIGS. 1-6A-B. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A method of performing a read operation on a magneto-resistive random-access memory (MRAM) bit-cell comprising:
   providing a voltage signal across one or more storage elements of the MRAM bit-cell;
   determining an electrical resistance of the one or more storage elements of the MRAM bit-cell; and
   removing the voltage signal from the MRAM bit-cell prior to an end of an incubation delay interval.

2. The method of claim 1, wherein the electrical resistance is determined by a comparison of the one or more storage elements and one or more reference elements, respectively.

3. The method of claim 1, wherein the applied voltage across two terminals of the MRAM bit-cell is close to or higher than a critical write voltage.

4. The method of claim 1, further comprising:
   reducing the voltage signal during the incubation delay interval prior to the removal of the voltage signal.

5. The method of claim 1, further comprising:
   providing an output of the MRAM-bit-cell corresponding to the determined electrical resistance.

6. The method of claim 1, wherein the MRAM bit-cell comprises spin-transfer torque MRAM (STT-MRAM) having one or more metal-oxide-semiconductor field-effect transistors (MOSFETs).

7. The method of claim 6, wherein the MRAM bit-cell comprises one or more MOSFETs and one or more MTJ devices.

8. The method of claim 6, wherein the MRAM bit-cell comprises a DRAM/MRAM hybrid memory.

9. The method of claim 1, wherein the MRAM bit-cell comprises a spin-hall effect MRAM device.

10. A method of performing read and write operations on a magneto-resistive random-access memory (MRAM) bit-cell comprising:
    for a write operation:
       applying a first voltage signal across a resistive memory of the MRAM bit-cell, wherein the first voltage signal is greater than a critical write voltage, and wherein the first voltage signal is applied for a duration longer than a critical write duration; and
    for a read operation:
       applying a second voltage signal across the resistive memory of the MRAM bit-cell, wherein the second voltage signal is greater than or close to the critical write voltage.

11. The method of claim 10, wherein the second voltage signal is applied for a duration less than a critical write duration.

12. The method of claim 10, wherein the second voltage signal corresponds to an operating voltage of the MRAM bit-cell.

13. The method of claim 12, wherein the second voltage signal is greater than the first voltage signal.

14. The method of claim 10, wherein the MRAM bit-cell comprises spin-transfer torque MRAM (STT-MRAM) having one or more metal-oxide-semiconductor field-effect transistors (MOSFETs).

15. The method of claim 14, wherein the MRAM bit-cell comprises one or more MOSFETs and one or more MTJ devices.

16. The method of claim 14, wherein the MRAM bit-cell comprises a DRAM/MRAM hybrid memory.

17. The method of claim 10, wherein the MRAM bit-cell comprises a spin-hall effect MRAM device.

18. The method of claim 10, wherein the MRAM bit-cell comprises a multi-level cell (MLC) STT-MRAM.

19. The method of claim 18, wherein, for the write operation, the critical write duration is controlled based on an incubation delay interval.

20. A method of preventing an undesired write operation in a magneto-resistive random-access memory (MRAM) bit-cell comprising:
    in response to a voltage signal being applied across one or more storage elements of the MRAM bit-cell, removing the voltage signal from the MRAM bit-cell prior to an end of an incubation delay interval.

* * * * *